United States Patent [19]
Miyata et al.

[11] 3,808,564
[45] Apr. 30, 1974

[54] SEMICONDUCTOR IMPEDANCE CONVERSION CIRCUIT AND APPLICATIONS THEREOF

[75] Inventors: Takeo Miyata; Seiya Hamada, both of Kanagawa-ken; Katsuaki Inoue; Mikito Baba, both of Tokyo, all of Japan

[73] Assignee: Mitsumi Electric Company, Limited, Tokyo, Japan

[22] Filed: Aug. 23, 1972

[21] Appl. No.: 283,163

[30] Foreign Application Priority Data

Aug. 28, 1971 Japan........................46-66223
March 22, 1972 Japan........................47-28661

[52] U.S. Cl............................... 333/80 R, 333/80 T
[51] Int. Cl............................... H03h 11/00
[58] Field of Search.................. 333/80 R, 80 T, 32

[56] References Cited

UNITED STATES PATENTS 3,639,858 2/1972 Miyata et al. ................ 333/80 T X

*Primary Examiner*—Archie R. Borchelt
*Assistant Examiner*—Marvin Nussbaum
*Attorney, Agent, or Firm*—Marshall & Yeasting

[57] ABSTRACT

A semiconductor impedance conversion circuit which employs a semiconductor circuit consisting of two transistors, four inpedance elements or circuits, a DC voltage source and a DC current source and in which a negative impedance conversion function and a gyrator function are obtained between two terminals.

An oscillator employing the above semiconductor impedance conversion circuit and an oscillating capacitor.

A frequency modulator employing the above semiconductor impedance conversion circuit, an oscillating capacitor and a modulating signal source.

8 Claims, 14 Drawing Figures

SEMICONDUCTOR IMPEDANCE CONVERSION CIRCUIT AND APPLICATIONS THEREOF

BACKGROUND OF THE INVENTION

1. Field of the Invention

This invention relates to a semiconductor impedance conversion circuit and an oscillator and a frequency modulator using the same. .

2. Description of the Prior Art

Various semiconductor impedance conversion circuits have heretofore been proposed but they require many impedance elements or circuits and transistors and exhibit a characteristic dependent upon the temperature dependency of the common base current amplification factor of transistors employed therein.

SUMMARY OF THE INVENTION

The present invention has for its object to provide a semiconductor impedance conversion circuit which employs less impedance elements or circuits and transistors and has no temperature dependency.

With the present invention, it is possible to obtain a simple semiconductor impedance conversion circuit with a semiconductor circuit consisting of two transistors, four impedance elements or circuits and a DC bias source, which is capable of providing a negative impedance conversion function and/or a gyrator function.

Another object of this invention is to provide an oscillator and a frequency modulator employing the above-mentioned semiconductor impedance conversion circuit.

Other objects, features and advantages of this invention will become apparent from the following description taken in conjunction with the accompanying drawings.

DESCRIPTION OF THE PREFERRED EMBODIMENTS

Figure 1:
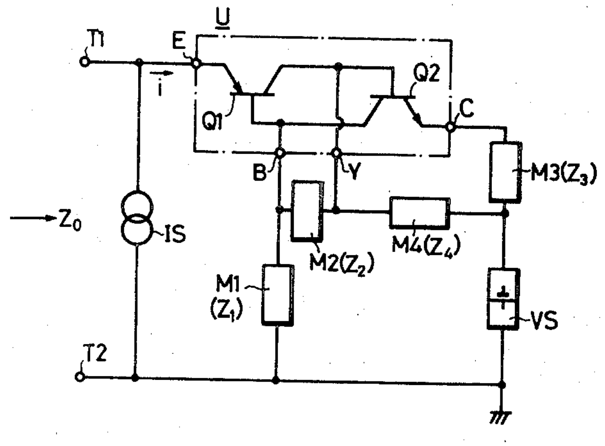
FIGS. 1 and 2 are circuit diagrams showing examples of the basic construction of a semiconductor impedance conversion circuit of this invention.

With reference to FIG. 1 one basic construction of this invention will be described first in detail. Reference character U indicates generally a semiconductor circuit having first, second, third and fourth terminals E, B, Y and C, which includes a PNP-type transistor Q1 and an NPN-type transistor Q2 and in which the emitter of the transistor Q1 is connected to the terminal E, the base of the transistor Q1 and the collector of the transistor Q2 are connected together to the terminal B, the collector of the transistor Q1 and the base of the transistor Q2 are connected together to the terminal Y and the emitter of the transistor Q2 is connected to the terminal C.

The terminal E of the semiconductor circuit U is connected to an external connection terminal T1 and a bias current source IS, an impedance element or circuit M1 and an impedance element or circuit M2 are connected between the terminal E and an external connection terminal or common ground terminal T2, between the terminals B and T2 and between the terminals B and Y respectively. Further, the terminals C and Y are respectively connected through impedance elements or circuits M3 and M4 to the one end of a DC bias voltage source VS the other end of which is connected to the terminal T2. In this case, the impedance elements or circuits M1, M3 and M4 must be so constructed that the terminals B, C and Y are coupled with the voltage source VS in a DC manner respectively.

With such a construction of this invention as described above, if the common base current amplification factors of the transistors Q1 and Q2 are taken as $\alpha 1$ and $\alpha 2$ respectively, if the voltages between their bases and the emitters are taken as $v_1$ and $v_2$ respectively, if the impedances of the elements or circuits M1, M2, M3 and M4 are taken as $Z_1$, $Z_2$, $Z_3$ and $Z_4$ respectively and if a current flowing to the terminal E is taken as $i$, the impedance $Z_0$ between the terminals T1 and T2 is given by the following equation.

$$Z_0 = 1/i \left\{ V_1 - Z_1 \cdot V_2 (Z_2\alpha_2 + Z_4)/P_2 \right\} - Z_1 P_1/P_2 \qquad (1)$$

where $$P_1 = Z_4[Z_2 \left\{ (1-\alpha_1)(1+Z_3/Z_4) - \alpha_2 \right\} + Z_3] \qquad (2)$$

$$P_2 = Z_3[Z_2 \left\{ Z_4/Z_3(\alpha_2 - 17 - 1 \right\} - Z_1(1+Z_4/Z_3) - Z_4] \qquad (3)$$

Here, $$|(1-\alpha_1)(1+Z_3/Z_4)| << |\alpha_2| \qquad (4)$$

$$|Z_4/Z_3 (\alpha_2 - 1)| << 1 \qquad (5)$$

Accordingly, if the following condition is satisfied:

$$|1-\alpha_1| / |\alpha_2| - |1-\alpha_1| << |Z_4| / |Z_3| << |1/1-\alpha_2| \qquad (6)$$

it follows that $$P_1 = Z_4(-\alpha_2 Z_2 + Z_3) \qquad (7)$$

$$P_2 = Z_3 \left\{ -Z_2 - Z_1(1 + Z_4/Z_3) - Z_4 \right\} \qquad (8)$$

The condition of the equation (6) can be satisfied for the following reason. Namely, if the common emitter current amplification factors of the transistors Q1 and Q2 are taken as $h_{fe1}$ and $h_{fe2}$ respectively, they are given in the following forms.

$$h_{fe1} = \alpha_1/1 - \alpha_1 \cong 1/1 - \alpha_1 \qquad (9)$$

$$h_{fe2} = \alpha_2/1 - \alpha_2 \cong 1/1-\alpha_2 \tag{10}$$

Therefore, the equation (6) becomes as follows:

$$\left|\frac{1}{h_{fe1}} \cdot \frac{1}{1-\frac{1}{h_{fe2}}}\right| \ll \left|\frac{Z_4}{Z_3}\right| \ll |h_{fe2}| \tag{11}$$

For example, if $|h_{fe1}| = |h_{fe2}| = 200$, it follows that $$1/200 << Z_4/Z_3 << 200 \tag{11'}$$

and if $Z_3 \cong Z_4$, the condition of the equation (6) may well be satisified. Accordingly, the third term on the right side of the equation (1) is obtained by the use of the equations (7) and (8) as follows:

$$-Z_1\frac{P_1}{P_2} = -Z_1\frac{Z_4}{Z_3}\left\{1-\frac{(1-\alpha_2)Z_2+Z_3+Z_4+Z_1\left(1+\frac{Z_4}{Z_3}\right)}{Z_2+Z_1\left(1+\frac{Z_4}{Z_3}\right)+Z_4}\right\} \tag{12}$$

where $$|Z_2| >> |Z_1(1+Z_4/Z_3)+Z_3| \tag{13}$$

$$|(1-\alpha_2)Z_2| << |Z_3+Z_4+Z_1(1+Z_4/Z_3)| \tag{14}$$

Accordingly, if the following condition is satisfied:

$$|Z_1(1+Z_4/Z_3)+Z_4| << |Z_2| << |1/1-\alpha_2\{Z_3+Z_4+Z_1(1+Z_4/Z_3\}| \tag{15}$$

the equation (12) becomes as follows:

$$-Z_1\frac{P_1}{P_2} = -Z_1\frac{Z_4}{Z_3}\left\{1-\frac{Z_3+Z_4+Z_1\left(1+\frac{Z_4}{Z_3}\right)}{Z_2}\right\} \tag{16}$$

Rewritten by the use of the equation (10), the equation (15) becomes as follows:

$$|Z_1(1+Z_4/Z_3)+Z_4| << | {}_4| << |h_{fe2}\{Z_3+Z_4+Z_1(1+Z_4/Z_3)| \tag{17}$$

For example, if $|Z_3| = |Z_4| = |Z_1| = 1(K\Omega)$ and if $|h_{fe2}| = 200$, it follows that $$3(K\Omega) << |Z_2| << 800(K\Omega) \tag{18}$$

From the equation (8), it follows that $$P_2 = -Z_2 \cdot Z_3 \tag{19}$$

within a range in which the equation (15) are satisfied. Accordingly, if the equation (19) is used as the second term on the right side of the equation (1) and if $\alpha_2 \approx 1$, the equation (1) is expressed as follows:

$$Z_0 = \frac{1}{1}\left\{v_1 + \frac{Z_1(Z_2+Z_4)}{Z_2Z_3}\frac{1}{2}\right\} - Z_1\frac{Z_4}{Z_3}\left\{1-\frac{Z_3+Z_4+Z_1\left(1+\frac{Z_4}{Z_5}\right)}{Z_2}\right\} \tag{20}$$

By the way, if the absolute value of the first term of the equation (20) is very smaller than that of the second term, that is, for example, if $|Z_3| \cong |Z_4| \cong |Z_1| = 1(K\Omega)$, if $|Z_2| = 30(K\Omega)$ and if $v_1/i \cong v_2/i = 10(\Omega)$, the first and second terms become about $20(\Omega)$ and about $1(K\Omega)$ respectively. Consequently, in the equation (20) the second term is dominant and $Z_0$ becomes as follows:

$$Z_0 = -Z_1\frac{Z_4}{Z_3}\left\{1-\frac{Z_3+Z_4+Z_1\left(1+\frac{Z_4}{Z_3}\right)}{Z_2}\right\} \tag{21}$$

$$= -Z_1\frac{Z_4}{Z_3} + \frac{Z_1\frac{Z_4}{Z_3}\left\{Z_3+Z_4+Z_1\left(1+\frac{Z_4}{Z_3}\right)\right\}}{Z_2} \tag{22}$$

Accordingly, if $$K_1 = Z_4/Z_3 \tag{23}$$

$$K_2 = Z_1 \cdot K_1\{Z_3+Z_4+z_1(1+K_1)\} \tag{24}$$

it follows that $$Z_0 = -K_1 \cdot Z_1 + K_2/Z_2 \tag{25}$$

Therefore, with the construction described previously in connection with FIG. 1, the impedance $Z_0$ which is converted from those $Z_1$ to $Z_4$ of the elements or circuits M1 to M4, given by the equation (25), is obtainable between the terminals T1 and T2. Accordingly, the construction of FIG. 1 may have an impedance conversion function including a negative impedance conversion function for $Z_1$ and a gyrator function for $Z_2$.

Further, if the value of the impedance $Z_2$ of the element or circuit M2 is very great in the construction of FIG. 1, it follows that $$Z_{.} = -K_1 \cdot Z_1 \quad (26)$$

and it is possible to obtain an impedance conversion circuit having a negative impedance conversion function for $Z_1$.

Moreover, if the impedances $Z_1$ and $Z_3$ of the elements or circuits M1 and M3 are selected to bear the following relation:

$$|Z_3| << |Z_1| \quad (27)$$

the equation (24) becomes as follows:

$$K_2 = Z_1^2 K_1 (1 + K_1) \quad (28)$$

Accordingly, $Z_0$ may be a function including only $K_1 = Z_4/Z_3$ as an indepdent variable excepting $Z_1$ and $Z_2$, and hence $Z_0$ may be determined only by the ratio $Z_4/Z_3$ and $Z_1$ and/or $Z_2$.

Figure 2:
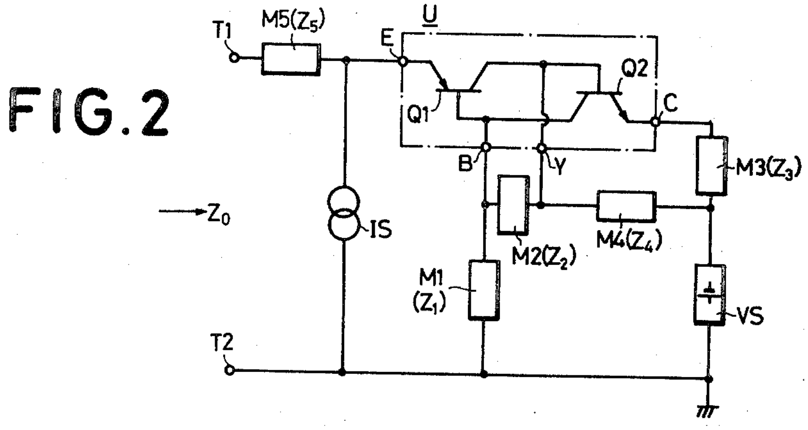

Referring now to FIG. 2, another example of the basic construction of this invention will hereinbelow be described. In the present example, parts corresponding to those in FIG. 1 are identified by the same reference characters and no detailed description will be repeated. The illustrated example is identical in construction with that of FIG. 1 except that an impedance element or circuit M5 exhibiting an impedance given by the following equation:

$$Z_5 = |K_1 \cdot Z_1| \quad (29)$$

is connected in series to the terminal T1 or E.

It will be apparent that, with such a construction as shown in FIG. 2, the impedance $Z_0$ viewed from the terminals T1 and T2 may be as follows:

$$\begin{aligned} Z_0 &= -K_1 Z_1 + K_2/Z_2 + Z_5 \\ &= -K_1 Z_1 + K_2/Z_2 + K_1 Z_1 \\ &= +K_2/Z_2 \end{aligned} \quad (30)$$

Accordingly, the construction of FIG. 2 may have a gyrator function for $Z_2$.

Figure 3:
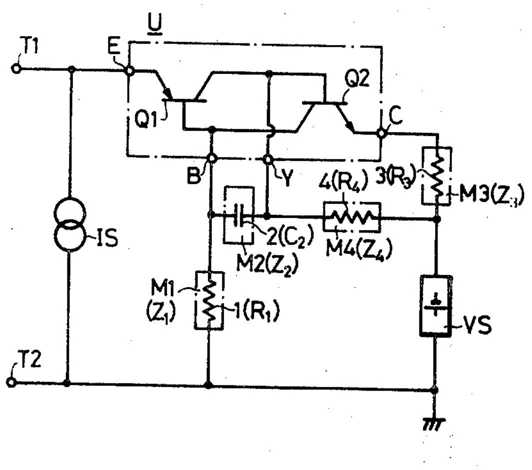
FIGS. 3 to 8, inclusive, are circuit diagrams illustrating concrete examples of the semiconductor impedance conversion circuit of this invention.

Turning now to FIG. 3, a concrete embodiment of this invention will be described, which is constructed on the basis of the basic construction depicted in FIG. 1 and in which parts corresponding to those in FIG. 1 are marked with the same reference characters but no detailed description will be repeated. In the present example, the elements or circuits M1, M2, M3 and M4 are formed with a resistor 1 having a resistance $R_1$, a capacitor 2 having a capacitance $C_2$, a resistor 3 having a resistance $R_3$ and a resistor 4 having a resistance $R_4$ respectively.

With such an arrangement as shown in FIG. 3, the impedances $Z_1$, $Z_3$ and $Z_4$ mentioned previously in connection with FIG. 1 are represented by $R_1$, $R_3$ and $R_4$ respectively and that $Z_2$ is represented by $1/j\omega C_2$. Therefore, if $R_1$, $R_3$, $R_4$ and $1/j\omega C_2$ in this case are suitably selected in a manner to provide conditions similar to those for obtaining the aforementioned equation (25), the impedance $Z_0$ between the terminals T1 and T2 is given in the following form:

$$\begin{aligned} Z_0 &= -K_1 Z_1 + K_2/Z_2 \\ &= -Z_4/Z_3\, Z_1 + Z_1\, Z_4/Z_3 \{ Z_3 + Z_4 + Z_1 (1 + Z_4/Z_3)\} 1/Z_2 \\ &= -R_4/R_3\, R_1 + j\omega C_2 R_3/R_4 \ \{R_3 + R_4 + R_1 (1 + R_4/R_3)\} \end{aligned} \quad (31)$$

Accordingly, the circuit of the construction depicted in FIG. 3 is obtainable between the terminals T1 and T2 a series impedance of a negative resistance Rin with an inductance L expressed by the following equations: Rin $$= -R_4/R_3 \cdot R_1 \quad (32a)$$

$$L = C_2 R_1 \cdot R_3/R_4 \ \{R_4 + R_3 + R_1(1 + R_4/R_3)\} \quad (32b)$$

In this case, the impedance $Z_0$ is obtained as a value which does not include the common base current amplification factors $\alpha_1$ and $\alpha_2$ of the transistors Q1 and Q2 of the semiconductor circuit U, so that even if the common base current amplification factors $\alpha_1$ and $\alpha_2$ have temperature dependency, there is no possibility of the impedance being affected by temperature.

Figure 4:
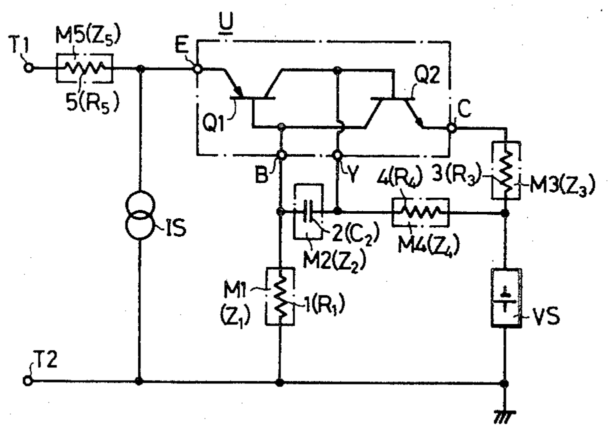

With reference to FIG. 4 another concrete embodiment of this invention will hereinbelow be described, which is constructed based on the basic construction of this invention illustrated in FIG. 2 and in which elements corresponding to those in FIG. 2 are indicated by the same reference characters and no detailed description will be given. In the present example, the elements or circuits M1, M3 and M4 are formed with resistors 1, 3 and 4 having resistances $R_1$, $R_3$ and $R_4$ respectively and the element or circuit M2 is formed with a capacitor 2 having capacitance $C_1$ as is the case with the example of FIG. 1. Further, the element or circuit M5 is formed with a resistor 5 having a resistance $R_5$.

With such a construction, the impedances $Z_1$, $Z_2$, $Z_3$, $Z_4$ and $Z_5$ referred to previously in connection with FIG. 2 are represented by $R_1$, $1/j\omega C_1$, $R_3$, $R_4$ and $R_5$ respectively, so that if $R_1$, $1/j\omega C_1$, $R_3$ and $R_4$ are suitably selected in a manner to provide conditions similar to those for obtaining the aforementioned equation (25) and if $R_5$ is suitably selected in a manner to provide conditions for obtaining the equation (29), the impedance $Z_0$ between the terminals T1 and T2 is given in the following form based on the aforementioned equation (30):

$$Z_0 = j\omega C_2 R_1 \cdot R_3/R_4 \ \{R_4 + R_3 + R_1(1 + R_4/R_3)\} \quad (33)$$

Thus, the circuit of the construction of FIG. 4 may provide between the terminals T1 and T2 an impedance based on the inductance expressed by the aforementioned equation (32b). Also in this case, the impedance is free from the temperature dependency of the common base current amplification factors $\alpha_1$ and $\alpha_2$ of the transistors Q1 and Q2.

Figure 5:
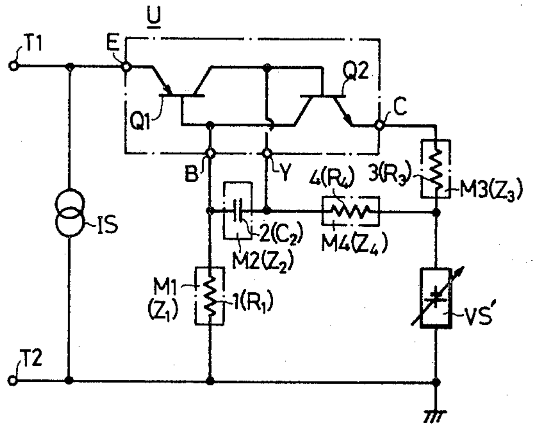

Turning to FIG. 5, another example of this invention will be described, which is identical in construction with the example of FIG. 3 except that the bias voltage source VS in the latter example is replaced with a variable bias voltage source VS'.

With such a construction, a variable bias voltage from the variable bias voltage source VS' is fed between the terminals B and Y, and consequently between the collectors and the bases of the transistors Q1 and Q2, so that their collector-base junction capacitances are made variable. Since these junction capacitances are parallel to the capacitance of the capacitor 2, the capacitance $C_2$ in the equation (32*b*) equivalently varies with the variable bias voltage. Accordingly, it is possible with the construction of FIG. 5 to obtain the function of a variable impedance device while holding the effect described previously in connection with FIG. 3.

Figure 6:
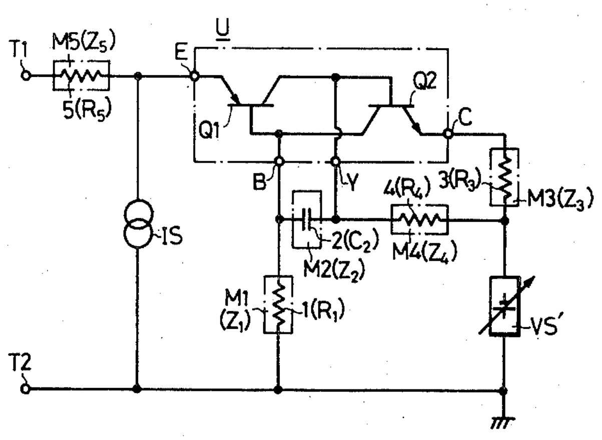

In FIG. 6, there is illustrated another example of this invention, which is identical in construction with the example of FIG. 4 except that the bias voltage source VS in the latter example is substituted with a variable bias voltage source VS' as is the case with the example of FIG. 5.

With the construction of this example, the junction capacitances between the collectors and the bases of the transistors Q1 and Q2 are made variable, with the result that the junction capacitances vary with the capacitance $C_2$ in the equation (32*b*) as in the example of FIG. 4. Accordingly, it is possible to obtain a variable inductance while holding the effect mentioned previously in connection with FIG. 4.

Figure 7:
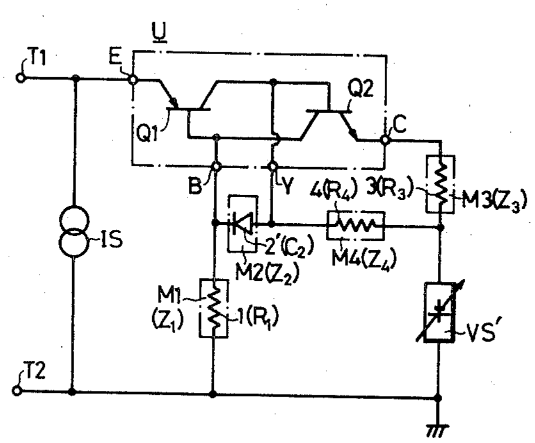
Figure 8:
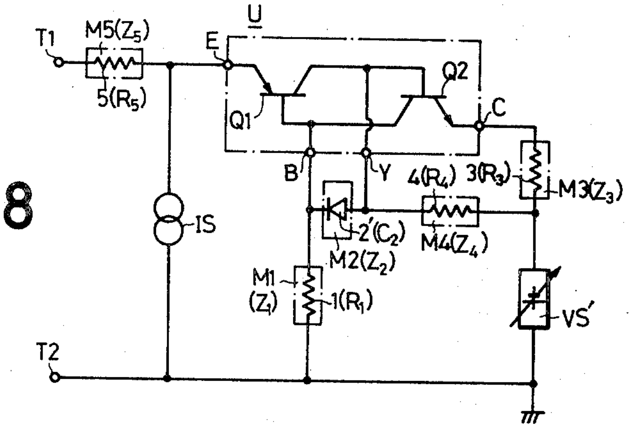

Referring now to FIGS. 7 and 8, other examples of this invention will be described, which are identical in construction with the examples of FIGS. 5 and 6 respectively except that the capacitors in the latter examples are replaced with voltage variable capacitance elements 2' such as varicaps.

With the constructions of these examples, the capacitance of the element 2' is changed by the variable bias voltage derived from the variable bias voltage source VS', so that the value of $C_2$ in the equation (32*b*) is altered and, at the same time, the junction capacitances between the collectors and the bases of the transistors Q1 and Q2 are altered as described previously in connection with FIGS. 5 and 6, thus providing the function of the variable impedance element which is similar to that obtainable with the examples of FIGS. 5 and 6 but more effective than in the latter.

Figure 9:
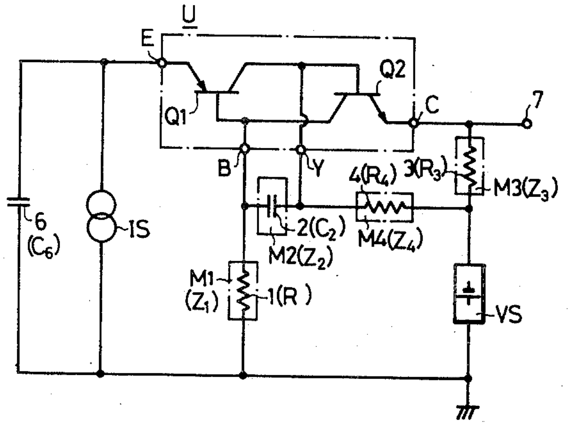
FIGS. 9, 10 and 11, inclusive, are circuit diagrams showing examples of an oscillator employing the semiconductor impedance conversion circuits depicted in FIGS. 3, 5 and 7 respectively.

With reference to FIG. 9 another example of this invention will hereinbelow be described, which is identical in construction with the example of FIG. 3 except the connection of a capacitor 6 having a capacitance $C_6$ between the terminal E and ground and the omission of the terminals T1 and T2 in the construction of the FIG. 3 example.

With such a construction, if the capacitor 6 does not exist, the impedance between the terminal E and the ground may be that of the series circuit consisting of the negative Rin given by the equation (32*a*) and the inductance given by the equation (32*b*), so that the circuit can oscillate at a frequency determined mainly by the inductance L given by the equation (32*b*) and the capacitance $C_6$ and the oscillation output can be derived between the terminal 7 led out from the terminal C and the ground. In this case, since the constant determining the oscillation frequency is independent of the common base current amplification factors of the transistors Q1 and Q2, the oscillation frequency can be obtained independently of temperature.

Figure 10:
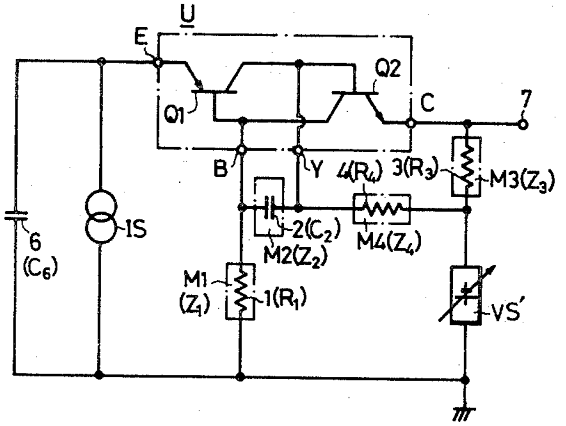

In FIG. 10, there is shown another example of this invention, which is identical in construction with the example of FIG. 9 except that the bias voltage source VS in FIG. 9 is replaced with a variable bias voltage source VS'.

With such a construction, the circuit can oscillate as in the example of FIG. 9 and the junction capacitances between the collectors and the bases of the transistors Q1 and Q2 are altered by the variable bias voltage from the variable bias voltage source VS' as described previously in connection with FIGS. 5 and 6, so that the oscillation frequency is changed, thus providing the function of a variable frequency oscillator circuit.

Figure 11:
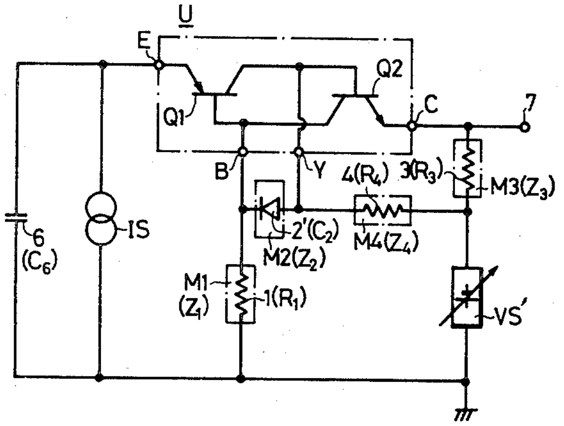

Turning to FIG. 11, another example of this invention will be described, which is identical in construction with the example of FIG. 10 except that the capacitor 2 in FIG. 10 is substituted with a voltage variable capacitance element 2'.

With the construction of this example, the circuit can oscillate as in the example of FIG. 10 and since the capacitance of the variable capacitance element 2' is also changed with the variable bias voltage, the oscillation frequency is thereby altered, thus providing a more effective variable oscillation circuit as compared with the example of FIG. 10.

Figure 12:
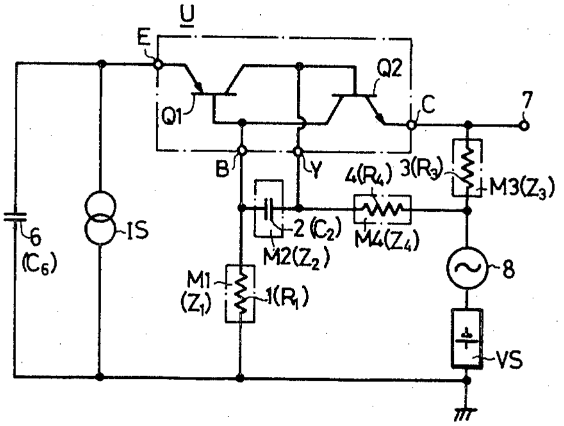
FIGS. 12 and 13 are circuit diagrams showing examples of a frequency oscillator employing the semiconductor impedance conversion circuit depicted in FIG. 9.

FIG. 12 illustrates another example of this invention, which is identical in construction with the example of FIG. 9 except that a modulating wave voltage source 8 is connected, for example, in series to the bias voltage source VS.

With such a construction, a modulating wave voltage from the modulating wave voltage from the modulating wave voltage source 8 is superimposed upon the aforementioned bias voltage between the terminals Y and B and between C and B, so that the oscillation frequency is modulated in accordance with the modulating wave voltage to provide the function of a frequency modulation circuit, as will be apparent from the description taken in conjunction with FIG. 10.

Figure 13:
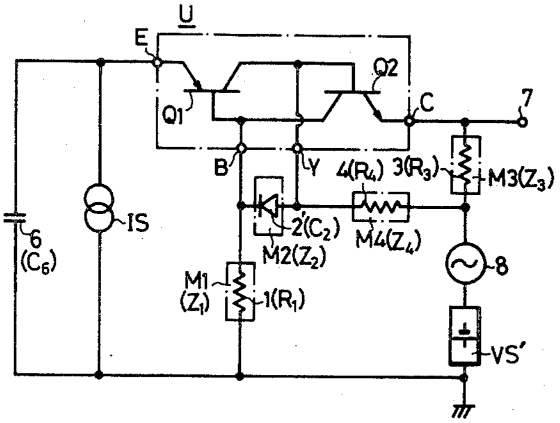

FIG. 13 shows another example of this invention, which is identical in construction with the example of FIG. 12 except that the capacitance element 2 in FIG. 12 is replaced with a voltage variable capacitance element 2' as in the example of FIG. 11.

With such a construction, the function of the frequency modulator circuit can be obtained as is the case with FIG. 12 but the presence of the voltage variable capacitance element 2' enables frequency modulation over a wide range of frequency deviation.

Figure 14:
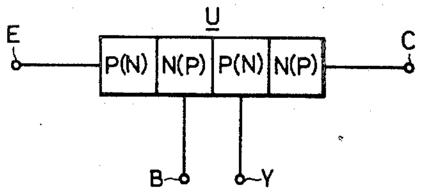
FIG. 14 is a schematic diagram showing another example of a semiconductor circuit employed in this invention.

While the present invention has been described in connection with the case where the transistors Q1 and Q2 of the semiconductor circuit U are PNP-and NPN-type respectively, they may be NPN- NPN-and PNP-type respectively where the bias voltage source, the bias current source and so on mentioned in the foregoing are reversed in polarity. Further, the semiconductor circuit U consisting of two transistors may be replaced with a circuit equivalent thereto which is formed with a PNPN- (or NPNP-) type transistor such as shown in FIG. 14 in which the terminals E, B, Y and C are connected to the layers respectively. Moreover, in the foregoing examples, the bias voltages applied between the terminals Y and B and between C and B are derived from the common bias voltage source but they may be derived from separate bias voltage sources. In addition, the bias voltage source, which is connected between the connection point of the elements or circuits M4 and M3 and the ground in the foregoing, may be connected in series to the element or circuit M1 on the side of the ground.

It will be apparent that many modifications and variations may be effected without departing from the scope of the novel concepts of this invention.

We claim as our invention

1. A semiconductor impedance conversion circuit comprising a semiconductor circuit or a circuit equivalent thereto, the semiconductor circuit including a first transistor of a first conductivity type and a second transistor of a second conductivity type, the emitter of the first transistor being connected to a first terminal, the base of the first transistor and the collector of the second transistor being connected together to a second terminal, the emitter of the second transistor being connected to a third terminal and the collector of the first transistor and the base of the second transistor being connected together to a fourth terminal, a first impedance element or circuit connected between the second terminal and a common terminal, a second impedance element or circuit connected between the second and fourth terminals, a third impedance element or circuit connected between the third and common terminals, a fourth impedance element or circuit connected between the fourth and common terminals, and a DC bias source for the semiconductor circuit or the circuit equivalent thereto, which is characterized in that an impedance $Z_0$ between the first and common terminals expressed as follows:

$$Z_0 = -K_1 Z_1 + K_2/Z_2$$

$$K_1 = Z_4/Z_3$$

$K_2=K_1K_1\{Z_3+Z_4+Z_1\ (1+K_1)\}$ is obtained, where $Z_1$, $Z_2$, $Z_3$ and $Z_4$ are the impedances of the first, second, third and fourth impedance elements or circuits.

2. A semiconductor impedance conversion circuit comprising a semiconductor circuit or a circuit equivalent thereto, the semiconductor circuit including a first transistor of a first conductivity type and a second transistor of a second conductivity type, the emitter of the first transistor being connected to a first terminal, the base of the first transistor and the collector of the second transistor being connected together to a second terminal, the emitter of the second transistor being connected to a third terminal and the collector of the first transistor and the base of the second transistor being connected together to a fourth terminal, a first impedance element or circuit connected between the second terminal and a common terminal, a second impedance element or circuit connected between the second and fourth terminals, a third impedance element or circuit connected between the third and common terminals, a fourth impedance element or circuit connected between the fourth and common terminals, and a DC bias source for the semiconductor circuit or the circuit equivalent there to, and a fifth impedance element or circuit connected at one end to the first terminal, which is characterized in that, under the following condition, $$Z_5 = K_1 Z_1$$

an impedance $Z_0$ between the other end of the fifth impedance element or circuit and the common terminal expressed as follows:

$$Z_0 = -K_1 Z_1 + K_2/Z_2 + Z_5$$
$$= +K_2/Z_2$$

is obtained, where $Z_1$, $Z_2$, $Z_3$, $Z_4$ and $Z_5$ are the impedances of the first, second, third, fourth and fifth impedance elements or circuits.

3. A semiconductor impedance conversion circuit according to claim 1, wherein the first, third and fourth impedance elements or circuits are first, third and fourth resistors respectively and the second impedance element or circuit is a capacitor and wherein the impedance $Z_0$ is expressed as follows:

$$Z_0 = -K_1 Z_1 + K_2/Z_2$$
$$= -R_4/R_3\ R_1 + j\omega C_2\ R_3/R_4\ \{R_3 + R_4 + R_1\ (1 + R_4/R_3)\}$$

where $R_1$, $R_3$ and $R_4$ are the resistances of the first, third and fourth resistors respectively, $C_2$ is the capacitance of the capacitor and $\omega$ is an operating angular frequency 4. A semiconductor impedance conversion circuit according to claim 2, wherein the first, third, fourth and fith impedance elements or circuits are resistors respectively and the second impedance element or circuit is a capacitor and wherein the impedance $Z_0$ is expressed as follows:

$$Z_0 = K_2/Z_2$$
$$= j\omega C_2 R_1\ R_3/R_4\ \{R_4 + R_3 + R_1\ (1 + R_4/R_3)\}$$

where $R_1$, $R_3$ and $R_4$ are the resistances of the first, third and fourth resistors respectively, $C_2$ is the capacitance of the capacitor and $\omega$ is an operating angular frequency.

5. A semiconductor impedance conversion circuit according to claim 3, wherein the DC bias source is made variable to provide the same effect as that obtained by changing the capacitance $C_2$ of the capacitor.

6. A semiconductor impedance conversion circuit according to claim 4, wherein the DC bias source is made variable to provide the same effect as that obtained by changing the capacitance $C_2$ of the capacitor.

7. A semiconductor impedance conversion circuit according to claim 5, wherein the capacitor is variable with the voltage of the DC bias source.

8. A semiconductor impedance conversion circuit according to claim 6, wherein the capacitor is variable with the voltage of the DC bias source.

* * * * *